United States Patent
Oh et al.

(10) Patent No.: US 9,177,573 B1
(45) Date of Patent: Nov. 3, 2015

(54) TUNNELING MAGNETORESISTIVE (TMR) DEVICE WITH MAGNESIUM OXIDE TUNNELING BARRIER LAYER AND FREE LAYER HAVING INSERTION LAYER

(71) Applicant: HGST Netherlands B.V., Amsterdam (NL)

(72) Inventors: Sangmun Oh, San Jose, CA (US); Zheng Gao, San Jose, CA (US)

(73) Assignee: HGST Netherlands B.V., Amsterdam (NL)

( * ) Notice: Subject to any disclaimer, the term of this patent is extended or adjusted under 35 U.S.C. 154(b) by 0 days.

(21) Appl. No.: 14/701,050

(22) Filed: Apr. 30, 2015

(51) Int. Cl.
*G11B 5/33* (2006.01)

(52) U.S. Cl.
CPC .......................................... *G11B 5/33* (2013.01)

(58) Field of Classification Search
CPC .................................. G11B 5/33; G11B 5/127
USPC ................................. 360/324.2, 324.1, 324.12
See application file for complete search history.

(56) References Cited

U.S. PATENT DOCUMENTS

| | | | |
|---|---|---|---|
| 7,495,867 B2 | 2/2009 | Sbiaa et al. | |
| 7,918,014 B2 | 4/2011 | Zhang et al. | |
| 8,320,080 B1 * | 11/2012 | Braganca et al. | 360/128 |
| 8,385,027 B2 | 2/2013 | Zhao et al. | |
| 8,427,791 B2 | 4/2013 | Gao et al. | |
| 8,498,084 B1 | 7/2013 | Leng et al. | |
| 8,873,204 B1 * | 10/2014 | Gao et al. | 360/319 |
| 2009/0121710 A1 | 5/2009 | Wang et al. | |
| 2011/0006384 A1 * | 1/2011 | Peng et al. | 257/421 |
| 2011/0273802 A1 | 11/2011 | Zhou et al. | |

OTHER PUBLICATIONS

Kobayashi, et al., "TMR Film and Head Technologies", FUJITSU Sci. Tech J., 42.1, p. 139 (Jan. 2006).

* cited by examiner

*Primary Examiner* — Allen T Cao
(74) *Attorney, Agent, or Firm* — Thomas R. Berthold

(57) ABSTRACT

A tunneling magnetoresistance (TMR) device has a thin MgO tunneling barrier layer and a free ferromagnetic multilayer. The free ferromagnetic multilayer includes a CoFeB first ferromagnetic layer, a face-centered-cubic (fcc) NiFe compensation layer with negative magnetostriction, and a body-centered-cubic (bcc) NiFe insertion layer between the CoFeB layer and the fcc NiFe compensation layer. An optional ferromagnetic nanolayer may be located between the MgO barrier layer and the CoFeB layer. An optional amorphous separation layer may be located between the CoFeB layer and the bcc NiFe insertion layer. The bcc NiFe insertion layer (and the optional amorphous separation layer if it is used) prevents the fcc NiFe layer from adversely affecting the crystalline formation of the MgO and CoFeB layers during annealing. The bcc NiFe insertion layer also increases the TMR and lowers the Gilbert damping constant of the free ferromagnetic multilayer.

20 Claims, 4 Drawing Sheets

TUNNELING MAGNETORESISTIVE (TMR) DEVICE WITH MAGNESIUM OXIDE TUNNELING BARRIER LAYER AND FREE LAYER HAVING INSERTION LAYER

BACKGROUND OF THE INVENTION

1. Field of the Invention

The invention relates generally to tunneling magnetoresistance (TMR) devices, and more particularly to a TMR read head with a magnesium oxide (MgO) tunneling barrier layer.

2. Description of the Related Art

A tunneling magnetoresistance (TMR) device, also called a magnetic tunneling junction (MTJ) device, is comprised of two ferromagnetic layers separated by a thin insulating tunneling barrier layer. The barrier layer is typically made of a metallic oxide that is so sufficiently thin that quantum-mechanical tunneling of charge carriers occurs between the two ferromagnetic layers. While various metallic oxides, such as alumina ($Al_2O_3$) and titanium oxide ($TiO_2$), have been proposed as the tunneling barrier material, the most promising material is crystalline magnesium oxide (MgO). The quantum-mechanical tunneling process is electron spin dependent, which means that an electrical resistance measured when applying a sense current across the junction depends on the spin-dependent electronic properties of the ferromagnetic and barrier layers, and is a function of the relative orientation of the magnetizations of the two ferromagnetic layers. The magnetization of one of the ferromagnetic layers, called the reference layer, is fixed or pinned, while the magnetization of the other ferromagnetic layer, called the free layer, is free to rotate in response to external magnetic fields. The relative orientation of their magnetizations varies with the external magnetic field, thus resulting in change in the electrical resistance. The TMR device is usable as a memory cell in a nonvolatile magnetic random access memory (MRAM) array and as TMR read head in a magnetic recording disk drive.

FIG. 1 illustrates a cross-sectional view of a conventional TMR read head 10. The TMR read head 10 includes a bottom "fixed" or "pinned" reference ferromagnetic (FM) layer 18, an insulating tunneling barrier layer 20, and a top "free" FM layer 32. The TMR read head 10 has bottom and top nonmagnetic electrodes or leads 12, 14, respectively, with the bottom nonmagnetic electrode 12 being formed on a suitable substrate. The FM layer 18 is called the reference layer because its magnetization is prevented from rotation in the presence of an applied magnetic field in the desired range of interest for the TMR device, i.e., the magnetic field from a recorded region of the magnetic layer in a magnetic recording disk. The magnetization of the reference FM layer 18 can be fixed or pinned by being formed of a high-coercivity film or by being exchange-coupled to an antiferromagnetic (AF) "pinning" layer. The reference FM layer 18 may be part of an antiparallel (AP) pinned or flux-closure structure, where two ferromagnetic layers are separated by an antiparallel coupling (APC) spacer layer and thus antiparallel-coupled to form a flux closure, as described in U.S. Pat. No. 5,465,185. The magnetization of the free FM layer 32 is free to rotate in the presence of an applied magnetic field in the range of interest. In the absence of the applied magnetic field, the magnetizations of the FM layers 18 and 32 are aligned generally perpendicular in the TMR read head 10. The relative orientation of the magnetizations of the FM layers 18, 32 determines the electrical resistance of the TMR device.

TMR devices with MgO tunneling barriers, like CoFe/MgO/CoFe devices, exhibit a very large magnetoresistance due to coherent tunneling of the electrons of certain symmetry. However, MgO tunnel junctions are required to have (001) epitaxy and perfect crystallinity. The MgO barrier layer is typically formed by sputter deposition and subsequent annealing, which forms the crystalline structure. It has been found that when boron (B) is used in one or more of the reference and free ferromagnetic layers, higher tunneling magnetoresistance ($\Delta R/R$ or TMR) is observed after annealing. The amorphous CoFeB layer is known to promote high-quality crystallization of the MgO into the (001) direction, and thus higher TMR.

In a TMR read head, the free ferromagnetic layer should produce a high TMR and low magnetostriction. The free layer is typically a multilayer that includes a first ferromagnetic layer like CoFe or CoFeB near the MgO barrier layer that typically has high spin polarization but also high positive magnetostriction. To compensate for this the free multilayer also includes a relatively thick layer of NiFe alloy with negative magnetostriction and low Fe content, typically less than about 15 atomic percent (at. %), as a second ferromagnetic layer. However, the low-Fe NiFe second layer has a face-centered-cubic (fcc) crystalline structure, which destroys the epitaxial relationship between the MgO barrier and the first free layer after annealing. This leads to low TMR. To alleviate this problem, amorphous separation layers, like Ta, may be formed between the first and second layers. Ferromagnetic amorphous separation layers, like CoFeBTa, have also been proposed, as described in U.S. Pat. No. 8,427,791 B2, which is assigned to the same assignee as this application. However, these amorphous separation layers may result in a free layer with a high Gilbert damping constant (the parameter a, which is a dimensionless coefficient in the well-known Landau-Lifshitz-Gilbert equation). High damping results in high thermal-induced magnetic noise (sometimes called "mag-noise"). The effect of thermal excitations on the free layer becomes increasingly important as the free layer volume (and therefore its magnetic energy) is reduced. Because mag-noise is also proportional to the TMR signal, if the TMR is large then mag-noise is the dominant noise source in the TMR device and will limit the achievable signal-to-noise ratio (SNR). Thus it is desirable to design TMR devices with low damping so that mag-noise is suppressed.

What is needed is a TMR device with high TMR that has a MgO barrier layer and a free layer with low magnetostriction and low damping.

SUMMARY OF THE INVENTION

Embodiments of this invention relate to a TMR device with a thin MgO tunneling barrier layer and a free ferromagnetic multilayer. The free ferromagnetic multilayer includes a CoFeB first ferromagnetic layer, a substantially face-centered-cubic (fcc) low-Fe NiFe compensation layer with negative magnetostriction, and a substantially body-centered-cubic (bcc) high-Fe NiFe insertion layer between the CoFeB first ferromagnetic layer and the fcc NiFe compensation layer. An optional Co, Fe or CoFe nanolayer may be located between the MgO barrier layer and the CoFeB first ferromagnetic layer. An optional amorphous separation layer like Ta, CoFeBTa or CoHf may be located between the CoFeB first ferromagnetic layer and the bcc NiFe insertion layer. The bcc NiFe insertion layer (and the optional amorphous separation layer if it is used) prevents the fcc NiFe layer from adversely affecting the (001) crystalline formation of the MgO and CoFeB layers during annealing. The bcc NiFe insertion layer also increases the TMR and lowers the Gilbert damping constant of the free ferromagnetic multilayer; however, the free layer magnetostriction can increase.

For a fuller understanding of the nature and advantages of the present invention, reference should be made to the following detailed description taken together with the accompanying figures.

DETAILED DESCRIPTION OF THE INVENTION

Figure 1:
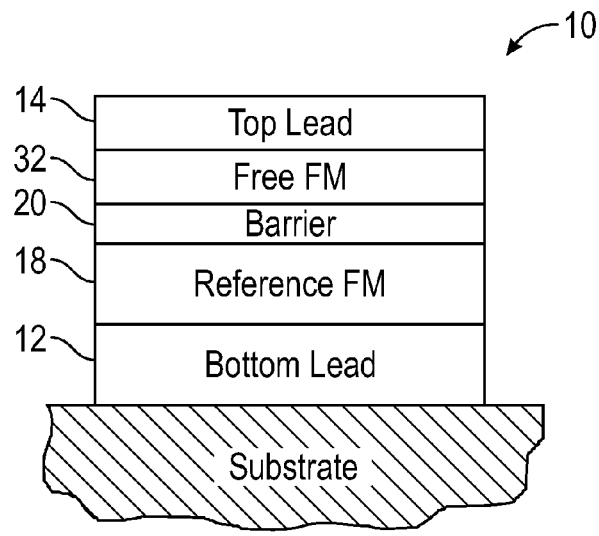
FIG. 1 is a schematic cross-sectional view illustrating the structure of a conventional tunneling magnetoresistive (TMR) read head.
Figure 2:
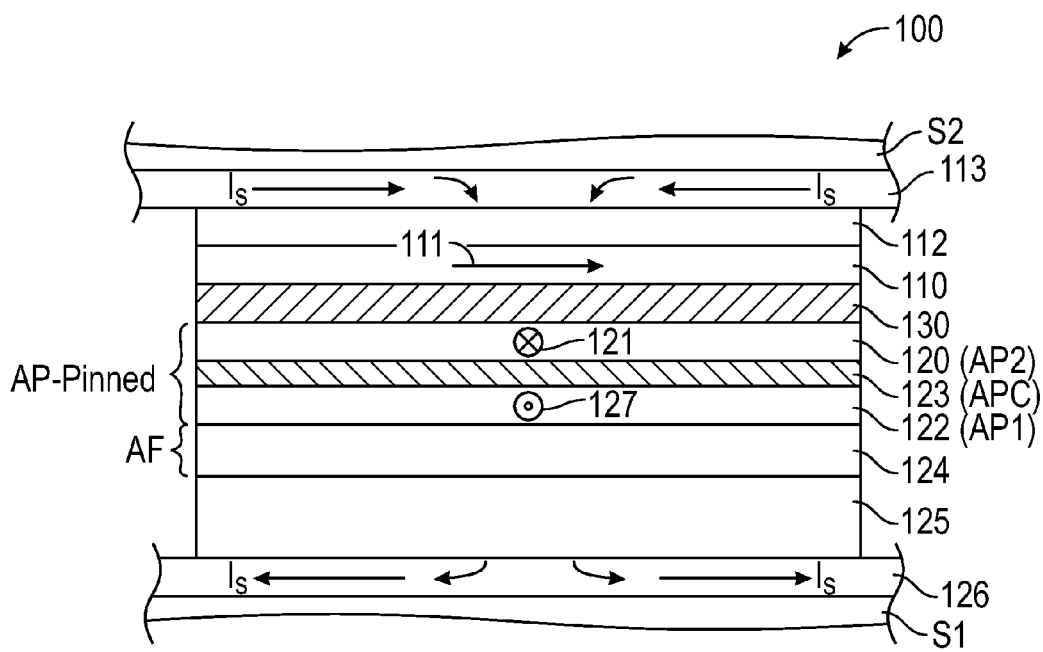
FIG. 2 is a schematic cross-sectional view illustrating the detailed structure of a prior-art TMR read head.

FIG. 2 is a cross-sectional highly schematic view illustrating the structure of a prior-art TMR read head 100 like that used in a magnetic recording disk drive. This cross-sectional view is a view of what is commonly referred to as the air-bearing surface (ABS) of the TMR read head 100. The TMR read head 100 includes a sensor stack of layers formed between two ferromagnetic shield layers S1, S2 that are typically made of electroplated NiFe alloy films. The lower shield S1 is typically smoothened by chemical-mechanical polishing (CMP) to provide a smooth surface for the growth of the sensor stack. The sensor stack includes a ferromagnetic reference layer 120 having a pinned magnetization 121 oriented transversely (away from the page), a ferromagnetic free layer 110 having a magnetization 111 that can rotate in the plane of layer 110 in response to transverse external magnetic fields from a recording disk, and an electrically insulating tunneling barrier layer 130, typically magnesium oxide (MgO), between the ferromagnetic reference layer 120 and ferromagnetic free layer 110. In the quiescent state, i.e., the absence of an applied field from the recording disk, the magnetization 111 of the free layer 110 is oriented orthogonal to the magnetization 121 of the reference layer 120.

The reference layer 120 may be a conventional "simple" or single pinned layer that has its magnetization direction 121 pinned or fixed, typically by being exchange coupled to an antiferromagnetic layer. However, in the example of FIG. 2, the reference layer 120 is part of the well-known antiparallel (AP) pinned or flux-closure structure, also called a "laminated" pinned layer, as described in U.S. Pat. No. 5,465,185. The AP-pinned structure minimizes magnetostatic coupling of the reference layer 120 with the free layer 110. The AP-pinned structure includes the reference ferromagnetic (AP2) layer 120 and a lower pinned ferromagnetic (AP1) layer 122 that are antiferromagnetically coupled across an AP coupling (APC) layer 123, such as Ru, Ir, Rh, or Cr, or alloys thereof. Due to the antiparallel coupling across the APC layer 123, the reference (AP2) and pinned (AP1) ferromagnetic layers 120, 122 have their respective magnetizations 121, 127 oriented antiparallel to each other. As a result, the net magnetization of the AP2 and AP1 ferromagnetic layers 120, 122 is so small that a demagnetizing field induced by the flux closure structure in the ferromagnetic free layer 110 is substantially minimized, and thus it becomes feasible for the TMR read head to operate optimally.

Located between the lower shield layer S1 and the AP-pinned structure are seed layer 125 and an antiferromagnetic (AF) pinning layer 124. The seed layer 125 facilitates the AF pinning layer 124 to grow a microstructure with a strong crystalline texture and thus develop strong antiferromagnetism. The seed layer 125 may be a single layer or multiple layers of different materials. The AF pinning layer 124 thus strongly exchange-couples to the ferromagnetic pinned layer 122, and thereby rigidly pins the magnetization 127 of the ferromagnetic pinned layer 122 in a direction perpendicular to and away from the ABS. The antiparallel coupling across the APC layer 123 then subsequently rigidly pins the magnetization 121 of the ferromagnetic reference layer 120 in a direction perpendicular to and towards the ABS, and antiparallel to magnetization 127. As a result, the net magnetization of the ferromagnetic AP2 and AP1 layers 120, 122 is rigidly pinned, and thus the optimal operation of the TMR read head is ensured. Instead of being pinned by an AF layer, the AP1 layer 122 may by itself be a hard magnetic layer or have its magnetization 127 pinned by a hard magnetic layer such as $Co_{100-x}Pt_x$ or $Co_{100-x-y}Pt_xCr_y$ (where x is between about and 8 and 30 atomic percent). The AP-pinned structure may also be "self-pinned". In a "self pinned" sensor the AP1 and AP2 layer magnetization directions 127, 121 are typically set generally perpendicular to the disk surface by magnetostriction and the residual stress that exists within the fabricated sensor.

Located between the ferromagnetic free layer 110 and the upper shield layer S2 is a layer 112, sometimes called a capping or cap layer. The layer 112 protects the ferromagnetic free layer 110 from chemical and mechanical damages during processing, so that ferromagnetic free layer 110 maintains good ferromagnetic properties.

In the presence of external magnetic fields in the range of interest, i.e., magnetic fields from written data on the recording disk, while the net magnetization of the ferromagnetic layers 120, 122 remains rigidly pinned, the magnetization 111 of the ferromagnetic free layer 110 will rotate in responses to the magnetic fields. Thus when a sense current $I_S$ flows from the upper shield layer S2 perpendicularly through the sensor stack to the lower shield layer S1, the magnetization rotation of the ferromagnetic free layer 111 will lead to the variation of the angle between the magnetizations of the ferromagnetic reference layer 120 and the ferromagnetic free layer 110, which is detectable as the change in electrical resistance. Because the sense current is directed perpendicularly through the stack of layers between the two shields S1 and S2, the TMR read head 100 is a current-perpendicular-to-the-plane (CPP) read head.

FIG. 2 also shows optional separate electrical leads 126, 113 between shields S1, S2, respectively, and the sensor stack. Leads 126, 113 may be formed of Ta, Ti, Ru, Rh or a multilayer thereof. The leads are optional and may be used to adjust the shield-to-shield spacing. If the leads 126 and 113 are not present, the bottom and top shields S1 and S2 are used as electrical leads. The ferromagnetic reference and free layers 120 and 110 are typically formed of a CoFe, CoFeB or NiFe layer, or formed of multiple layers comprising these films, while the ferromagnetic pinned layer 122 is typically formed of CoFe alloys. The seed layer 125 is typically formed of multiple layers comprising Ta/NiFeCr/NiFe, Ta/NiFe, Ta/Ru or Ta/Cu films. The AFM pinning layer 124 is typically made of an FeMn, NiMn, PtMn, IrMn, PdMn, PtPdMn or RhMn film. The cap layer 112 is typically made of Ru, Rh, Ti, Ta or a multilayer thereof.

While the TMR read head 100 shown in FIG. 2 is a "bottom-pinned" read head because the AP-pinned structure is below the free layer 110, the free layer 110 can be located below the AP-pinned structure. In such an arrangement the layers of the AP-pinned structure are reversed, with the AP2 layer 120 on top of and in contact with the barrier layer 130.

Figure 3:
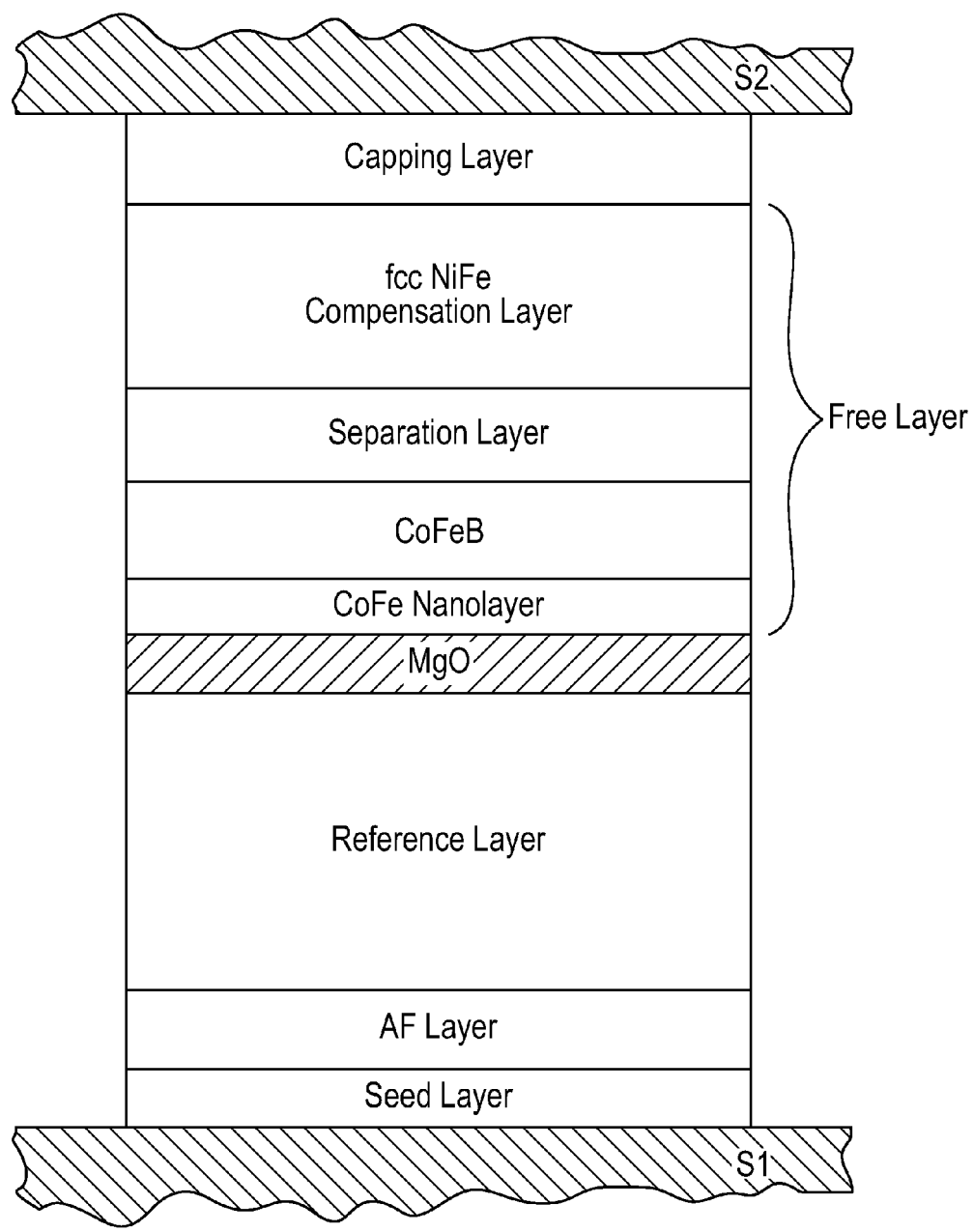
FIG. 3 is a schematic sectional view illustrating a typical reference-layer/MgO/free-layer structure in a prior art TMR read head.

MgO tunnel junctions are required to have (001) epitaxy and perfect crystallinity. The MgO barrier layer is typically formed by sputter deposition and subsequent annealing, which forms the crystalline structure. It has been found that the use of a thin amorphous CoFeB in one or both of the reference and free layer results in higher tunneling magnetoresistance (AR/R or TMR). The as-deposited amorphous CoFeB layer is known to promote high-quality crystallization of the MgO into the (001) direction, and thus higher TMR after annealing. Thus FIG. 3 is a schematic illustrating a typical reference-layer/MgO/free-layer structure according to the prior art. The reference-layer/MgO/free-layer structure is shown located between conventional shields S1 and S2 and with conventional antiferromagnetic (AF) layer and seed layer below the reference layer and a conventional capping layer above the free layer. The total thickness of each of the reference and free layers is typically between about 20 and 80 Å. The free ferromagnetic layer is depicted as a multilayer of a thin (e.g., between about 1-10 Å thick) optional CoFe "nanolayer" adjacent the MgO barrier layer, a CoFeB layer with a thickness between about 5-40 Å, a substantially face-centered-cubic (fcc) NiFe layer with a thickness between about 20-100 Å, and an optional amorphous separation layer (e.g., a Ta, Zr, Hf, CoHf or CoFeBTa layer) with a thickness between about 5-40 Å between the CoFeB layer and the fcc NiFe layer. The CoFe nanolayer and CoFeB layer have positive magnetostriction; however, the fcc NiFe layer has negative magnetostriction and may thus be considered a compensation layer that compensates for the positive magnetostriction. The fcc NiFe compensation layer has a substantially fcc crystalline structure. Because the fcc NiFe layer may adversely affect the epitaxial relationship between the MgO barrier and the CoFe nanolayer and CoFeB layer after annealing, and thus lower the TMR, the amorphous separation layer may be used to separate the fcc NiFe layer from the CoFe nanolayer and CoFeB layer.

In embodiments of this invention a substantially body-centered-cubic (bcc) NiFe insertion layer is located between the fcc NiFe compensation layer and the CoFeB layer (or the optional amorphous separation layer if one is used). The bcc NiFe insertion layer has a substantially bcc crystalline structure. Typically bcc NiFe has an Fe composition greater than or equal to 40 at. %. The bcc NiFe layer has a relatively high Fe content (equal to or greater than 40 at. %), as compared to the Fe content of the fcc NiFe compensation layer, which is typically less than or equal to 15 at. %. The bcc NiFe insertion layer decreases the Gilbert damping constant and also improves MR ratio, but magnetostriction also increases.

Figure 4:
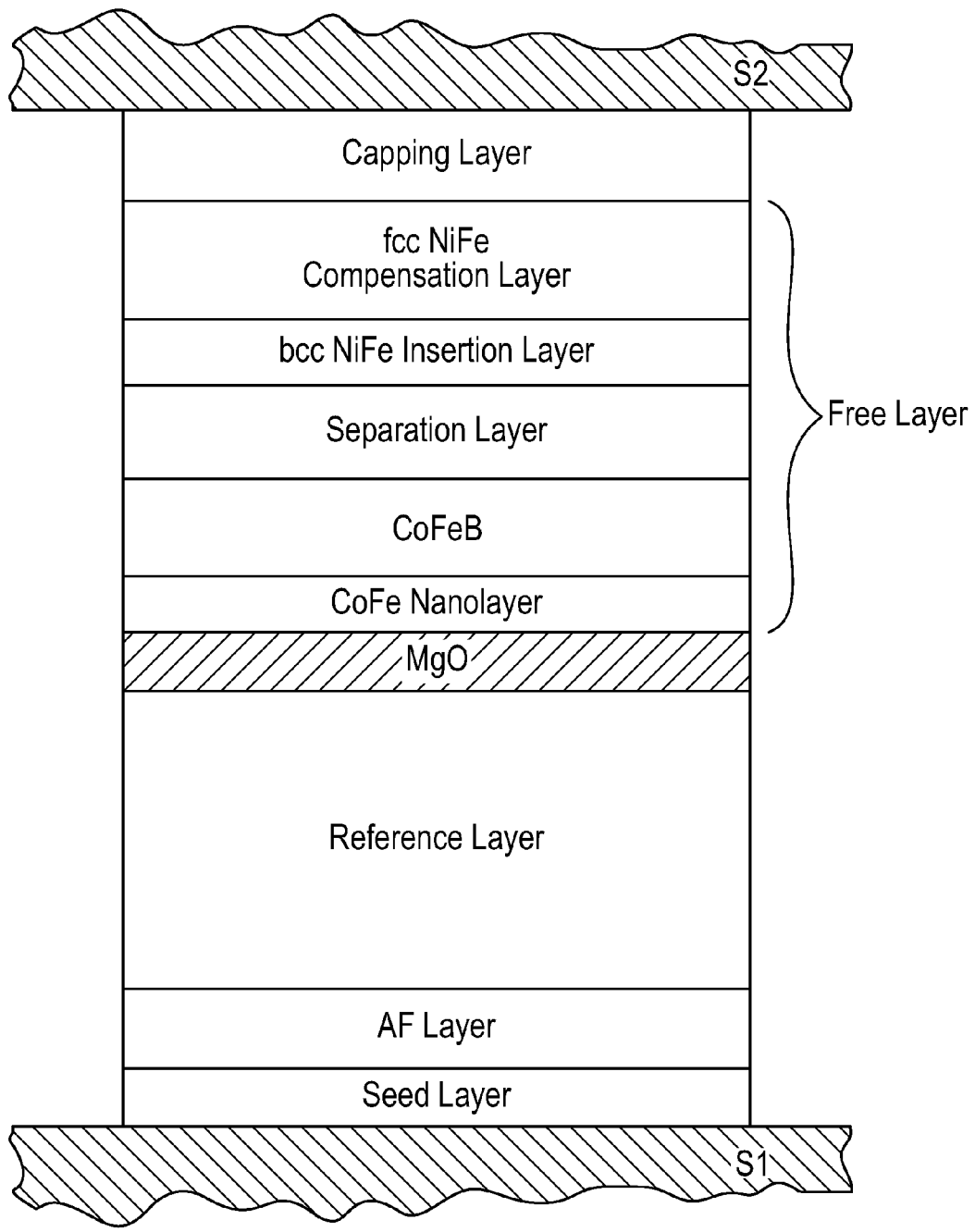
FIG. 4 is a schematic sectional view illustrating a reference-layer/MgO/free-layer structure in a TMR read head with a face-centered-cubic (fcc) NiFe alloy insertion layer according to an embodiment of the invention.

An embodiment is depicted in the sectional view of FIG. 4. The reference-layer/MgO/free-layer structure is shown located between conventional shields S1 and S2 and with conventional antiferromagnetic (AF) layer and seed layer below the reference layer and a conventional capping layer above the free layer. The reference layer may formed of a CoFe, CoFeB or NiFe layer (or multilayers of these materials) and may be a simple pinned reference layer or the AP2 layer of an AP-pinned structure, both of which are described above with respect to FIG. 2. The MgO tunneling barrier layer has a typical thickness of between about 7-15 Å. The optional CoFe alloy nanolayer has an Fe content between about 20 to 80 at. % and a thickness between about 1-10 Å. A Co or Fe nanolayer may be used as an alternative to the CoFe nanolayer. The CoFeB alloy layer has a typical composition of $(Co_xFe_{(100-x)})_{(100-y)}B_y$, where the subscripts represent at. %, x is equal to or greater than about 60 and less than about 100, and y is between about 10 and 20. The optional separation layer may be an amorphous Ta, Zr, Hf or CoFeBTa alloy layer, or an amorphous CoHf alloy layer with a thickness between about 1-30 Å and a Hf content between about 10-30 at. %. The fcc NiFe layer may have a thickness between about 10-60 Å and a low Fe content between about 2-15 at. %. In embodiments of this invention the bcc NiFe layer has a thickness between about 2-20 Å with an Fe content greater than or equal to 40 at. %, preferably between about 40-55 at. %.

The TMR read head described above and shown in FIG. 4 is fabricated in the conventional manner by deposition of the layers in the sensor stack by sputter deposition or other known thin-film deposition techniques. The structure is then annealed in the presence of an applied magnetic field to set the direction of the magnetization of the reference ferromagnetic layer. The annealing is typically done at about 250 to 290° C. for about 4 to 24 hours. The annealing also forms the MgO barrier layer with the desired crystallinity. The bcc NiFe insertion layer (and the optional separation layer if it is used) prevents the fcc NiFe layer from adversely affecting the (001) crystalline formation of the MgO and CoFeB layers. After deposition and annealing of the films, the stack is lithographically patterned and etched to define the desired dimensions for the read head.

The bcc NiFe layer has also been found to increase the TMR. For a structure like that shown in FIG. 4 with an amorphous separation and the bcc NiFe insertion layer, the TMR improvement was found to be between 2-10%.

Figure 5:
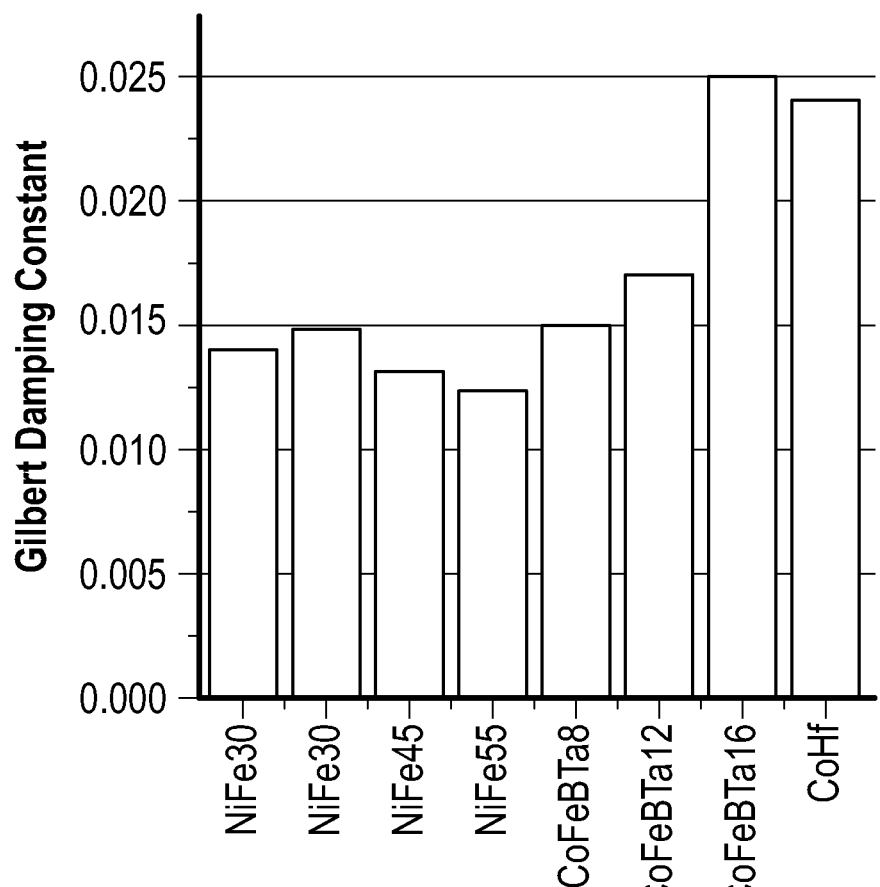
FIG. 5 is a bar chart that compares the Gilbert damping constant structures according to an embodiment of the invention with structures with no bcc NiFe insertion layer but with various amorphous separation layers.

The bcc NiFe layer has also been found to lower the Gilbert damping constant. This is shown in the bar chart of FIG. 5, which compares a structure like that in FIG. 4 with various bcc NiFe insertion layers to a structure with no bcc NiFe insertion layer but just various amorphous separation layers (CoFeBTa and CoHf). The structure with a bcc NiFe insertion layer exhibits a damping constant of about 0.012, while the structures with just amorphous separation layers exhibit damping constants from about 0.015 to 0.025. Especially noteworthy is that the structure with just the CoHf separation layer exhibits a damping constant of about 0.024. When the bcc NiFe insertion layer is added to this structure the damping constant is reduced dramatically to 0.012.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A tunneling magnetoresistive (TMR) device comprising:
    a substrate;
    a reference ferromagnetic layer on the substrate;
    a tunneling barrier layer consisting essentially of MgO on the reference ferromagnetic layer; and
    a free ferromagnetic multilayer comprising a first ferromagnetic layer on the tunneling barrier layer, a second ferromagnetic layer having negative magnetostriction, and a nickel-iron (NiFe) alloy ferromagnetic insertion layer having a substantially body-centered-cubic (bcc) crystalline structure between the first and second ferromagnetic layers of said free multilayer.

2. The device of claim 1 wherein said second layer of said free multilayer is a NiFe alloy layer having a substantially face-centered-cubic (fcc) crystalline structure.

3. The device of claim 2 wherein said fcc NiFe alloy layer contains Fe in an amount less than or equal to 15 atomic percent.

4. The device of claim 1 wherein said ferromagnetic insertion layer contains Fe in an amount greater than or equal to 40 atomic percent.

5. The device of claim 4 wherein said ferromagnetic insertion layer contains Fe in an amount greater than or equal to 40 atomic percent and less than or equal to 55 atomic percent.

6. The device of claim 1 wherein said first layer of said free multilayer is a CoFeB alloy layer.

7. The device of claim 1 further comprising a ferromagnetic nanolayer between the barrier layer and said first layer and selected from Co, Fe and an alloy consisting of Co and Fe.

8. The device of claim 1 further comprising an amorphous separation layer between said first layer of said free multilayer and said ferromagnetic insertion layer.

9. The device of claim 8 wherein said amorphous separation layer is selected from Ta, Zr, Hf, a CoFeBTa alloy and a CoHf alloy.

10. The device of claim 1 wherein the reference layer is part of an antiparallel (AP) pinned structure comprising a first AP-pinned (AP1) ferromagnetic layer having an in-plane magnetization direction, a second AP-pinned (AP2) ferromagnetic layer adjacent the tunneling barrier layer and having an in-plane magnetization direction substantially antiparallel to the magnetization direction of the AP1 layer, and an AP coupling (APC) layer between and in contact with the AP1 and AP2 layers, wherein the reference layer is the AP2 layer.

11. The device of claim 10 further comprising an antiferromagnetic layer exchange-coupled to the AP1 layer for pinning the magnetization direction of the AP1 layer.

12. A tunneling magnetoresistive (TMR) read head comprising:
a first shield layer of magnetically permeable material;
a reference ferromagnetic layer on the first shield layer and having an in-plane magnetization direction substantially prevented from rotation in the presence of an external magnetic field;
an electrically insulating tunneling barrier layer consisting essentially of MgO on and in contact with the reference layer;
a free ferromagnetic multilayer on the tunneling barrier layer and having an in-plane magnetization direction oriented substantially orthogonal to the magnetization direction of the reference layer in the absence of an external magnetic field, the free ferromagnetic multilayer comprising a first ferromagnetic layer on the tunneling barrier layer, a nickel-iron (NiFe) alloy ferromagnetic compensation layer having an Fe content equal to or less than 15 atomic percent, and a NiFe alloy ferromagnetic insertion layer having an Fe content equal to or greater than 40 atomic percent between said first ferromagnetic layer and said ferromagnetic compensation layer;
a capping layer on the free ferromagnetic multilayer; and
a second shield layer of magnetically permeable material on the capping layer.

13. The read head of claim 12 wherein the NiFe alloy compensation layer has a substantially face-centered-cubic (fcc) crystalline structure and the NiFe alloy insertion layer has a substantially body-centered-cubic (bcc) crystalline structure.

14. The read head of claim 12 wherein said first layer of said free multilayer is a CoFeB alloy layer.

15. The read head of claim 12 further comprising a ferromagnetic nanolayer between the barrier layer and said first layer and selected from Co, Fe and an alloy consisting of Co and Fe.

16. The read head of claim 12 further comprising a separation layer consisting of Co and Hf between said first layer of said free multilayer and said NiFe alloy insertion layer.

17. The read head of claim 12 further comprising:
an antiparallel (AP) pinned structure between the first shield layer and the barrier layer and comprising a first AP-pinned (AP1) ferromagnetic layer on the first shield layer and having an in-plane magnetization direction, a second AP-pinned (AP2) ferromagnetic layer having an in-plane magnetization direction substantially antiparallel to the magnetization direction of the AP1, and an AP coupling (APC) layer between and in contact with the AP1 and AP2 layers, and wherein said reference layer is said AP2 layer; and
an antiferromagnetic layer exchange-coupled to the AP1 layer for pinning the magnetization direction of the AP1 layer.

18. A tunneling magnetoresistive (TMR) read head comprising:
a first shield layer of magnetically permeable material;
a reference ferromagnetic layer on the first shield layer and having an in-plane magnetization direction substantially prevented from rotation in the presence of an external magnetic field;
an electrically insulating tunneling barrier layer consisting essentially of MgO on and in contact with the reference layer;
a free ferromagnetic multilayer on the tunneling barrier layer and having an in-plane magnetization direction oriented substantially orthogonal to the magnetization direction of the reference layer in the absence of an external magnetic field, the free ferromagnetic multilayer comprising:
a CoFe alloy nanolayer having an Fe content equal to or greater than 20 atomic percent and equal to or less than 80 atomic percent on the MgO barrier layer;
a CoFeB alloy ferromagnetic layer on the CoFe alloy nanolayer;
an amorphous separation layer selected from Ta, Zr, Hf, a CoFeBTa alloy and a CoHf alloy on the CoFeB alloy layer;
a NiFe alloy ferromagnetic compensation layer having an Fe content equal to or less than 15 atomic percent; and
a NiFe alloy ferromagnetic insertion layer having an Fe content equal to or greater than 40 atomic percent and less than or equal to 55 atomic percent between said separation layer and said NiFe alloy compensation layer;
a capping layer on the free ferromagnetic multilayer; and
a second shield layer of magnetically permeable material on the capping layer.

19. The read head of claim 18 wherein the NiFe alloy compensation layer has a substantially face-centered-cubic (fcc) crystalline structure and the NiFe alloy insertion layer has a substantially body-centered-cubic (bcc) crystalline structure.

20. The read head of claim 18 further comprising:
an antiparallel (AP) pinned structure between the first shield layer and the barrier layer and comprising a first AP-pinned (AP1) ferromagnetic layer on the first shield layer and having an in-plane magnetization direction, a second AP-pinned (AP2) ferromagnetic layer having an in-plane magnetization direction substantially antiparallel to the magnetization direction of the AP1, and an AP coupling (APC) layer between and in contact with the AP1 and AP2 layers, and wherein said reference layer is said AP2 layer; and
an antiferromagnetic layer exchange-coupled to the AP1 layer for pinning the magnetization direction of the AP1 layer.

* * * * *